United States Patent [19]

Okochi

[11] Patent Number: 4,667,173
[45] Date of Patent: May 19, 1987

[54] LINE FILTER

[75] Inventor: Sadao Okochi, Fussa, Japan

[73] Assignee: Kabushiki Kaisha Toshiba, Kawasaki, Japan

[21] Appl. No.: 815,049

[22] Filed: Dec. 31, 1985

[30] Foreign Application Priority Data

Aug. 29, 1985 [JP] Japan .................. 60-190112
Aug. 31, 1985 [JP] Japan .................. 60-192879

[51] Int. Cl.$^4$ ............................. H03H 7/09
[52] U.S. Cl. ..................... 333/177; 333/25; 333/168
[58] Field of Search ............ 333/12, 167, 168, 25, 333/175–176, 177, 181–185

[56] References Cited

U.S. PATENT DOCUMENTS

| | | | |
|---|---|---|---|
| 3,357,023 | 12/1967 | Hemmie | 333/25 X |
| 3,681,612 | 8/1972 | Vogl et al. | 333/12 X |
| 3,683,271 | 8/1972 | Kobayashi | 333/177 X |
| 4,259,705 | 3/1981 | Stifter | 333/12 X |

OTHER PUBLICATIONS

Curran–"Power Line Filter", IBM Technical Disclosure Bulletin, vol. 7, No. 7, Dec. 1964; p. 569.
Sekhri–"Power Line Filter" IBM Technical Disclosure Bulletin, vol. 17, No. 7, Dec. 1974; pp. 1998–1999.
Filters Quiet Noisy Power Lines, Electronic Products, Nov. 18, 1974, pp. 1–5.
Teller Elektronik Informatik, pp. 1–11, 33–36.
Schaffner Elektronik AG, pp. 17–18 and 28.

*Primary Examiner*—Marvin L. Nussbaum
*Attorney, Agent, or Firm*—Finnegan, Henderson, Farabow, Garrett & Dunner

[57] ABSTRACT

In a line filter having a first balun, first Y capacitors, a first X capacitor, a second balun, second Y capacitors and a second X capacitor connected between the input and output terminals of the line filter in the order named, the inductance of the first balun is larger than that of the second balun. The total capacitance of the first Y capacitors is larger than that of the second Y capacitors. The line filter can be divided into a front stage containing the first balun and a rear stage containing the second balun, the two stages being coupled via a wiring. The second balun can be constituted by a plurality of baluns.

19 Claims, 15 Drawing Figures

LINE FILTER

The present application claims priority of Japanese patent application Ser. Nos. 60-190112 and 60-192879 respectively filed on Aug. 29, 1985 and Aug. 31, 1985.

BACKGROUND OF THE INVENTION

The present invention relates to a line filter for reducing so-called normal mode and common mode noise generated during the use of a switching power source unit.

In general, when a switching power source is used as a power source unit for electronic equipment, so-called conduction noise is generated. This conduction noise can cause operation failures in the electronic equipment.

The conduction noise consists of two components: common mode noise (identical phase noise) and normal mode noise (differential noise). In conventional electronic equipment, a line filter as shown in FIG. 14 is connected to the input terminal of a switching power source unit to reduce these noise components.

Referring to FIG. 14, reference symbols $LD_1$ and $LD_2$ denote choke coils which comprise two insulated coils; $L_2$ denotes a balun (i.e., a balance to unbalance transformer) type choke coil; $C_{X1}$ and $C_{X2}$, capacitors inserted between lines L and N; and $C_{Y1}$ and $C_{Y2}$, capacitors inserted between the lines L and N and ground. The capacitors $C_{Y1}$ and $C_{Y2}$ each consist of two capacitors. In general, a capacitor inserted between the lines is called an X capacitor, and a capacitor inserted between the lines and ground is called a Y capacitor.

In the line filter with the arrangement described above, the insulated coils $LD_1$ and $LD_2$ work with the X capacitors $C_{X1}$ and $C_{X2}$ to eliminate normal mode noise generated between the lines (to be referred to as the L - N path hereinafter). The balun $L_2$ works with the Y capacitors $C_{Y1}$ and $C_{Y2}$ to eliminate common mode noise generated between the lines and ground (to be referred to as the L/N - G path hereinafter).

When capacitances of the X capacitors $C_{X1}$ and $C_{X2}$ are increased, normal mode noise can be almost eliminated since normal mode noise has a low level. Common mode noise, however, cannot be easily reduced due to the following reason.

FIG. 15 is an equivalent circuit diagram prepared for explaining common mode noise in consideration of a load noise source and an equivalent impedance R for input lines L and N.

Referring to FIG. 15, a reference symbol $E_C$ denotes a voltage generated as a noise source; and $E_R$, a noise voltage appearing between the line L/N and ground G.

The noise source voltage $E_C$ is generated mainly upon variations in potential at a power transistor in the switching power source unit. When the voltage $E_C$ is applied to the primary winding of a transformer (not shown) in the power source unit, a noise current $I_C$ flows to the ground terminal due to the behavior of a capacitor C inserted between the primary winding and ground. The noise current $I_C$ flows through the line filter LF and is fed back to the switching power source unit.

In this case, since the impedance R is present at the line input side of the switching power source unit, the noise voltage $E_R$ appears. This is defined as common mode noise.

The noise voltage $E_R$ can be substantially eliminated when the inductance of the choke coil $L_2$ and the capacitance of the Y capacitors $C_{Y1}$ and $C_{Y2}$ are increased. However, the grounded current $I_C$ must be as low as about several milliamperes for safe circuit operation. Therefore, the capacitances of the Y capacitors $C_{Y1}$ and $C_{Y2}$ inevitably have upper limits.

Necessary attenuation must be guaranteed by increasing the inductance of the coil $L_2$. When the inductance of the coil $L_2$ is increased, its size increases accordingly, and this results in higher cost than would an increase in the capacitance of the Y capacitor.

The noise voltage $E_R$, i.e., common mode noise, cannot therefore be easily eliminated by conventional line filters

SUMMARY OF THE INVENTION

It is an object of the present invention to provide a low-cost line filter wherein the upper capacitance of a Y capacitor can be properly limited and common mode noise can be eliminated without increasing the size of a choke coil.

It is another object of the present invention to provide a line filter which can effectively prevent leakage of common mode noise from a load through an input side.

It is still another object of the present invention to provide a line filter wherein the leakage current is small and predetermined attenuation can be obtained.

In order to achieve the above objects of the present invention, there is provided a line filter to be used in an electronic apparatus having an AC input unit and a switching power source unit, comprising: a first choke coil inserted between lines at an input side of the line filter; a second choke coil inserted between the lines at a load side of the line filter; first Y capacitors inserted between the lines and ground at an output side of the first choke coil; a first X capacitor inserted between the lines; second Y capacitors inserted between the lines and ground at an output side of the second choke coil; and a second X capacitor inserted between the lines at a load side of the second choke coil, wherein the first and second choke coils comprise baluns and the second choke coil has an inductance larger than that of the first choke coil.

DETAILED DESCRIPTION OF THE PREFERRED EMBODIMENT

A line filter according to an embodiment of the present invention will be described with reference to the accompanying drawings.

Figure 1:
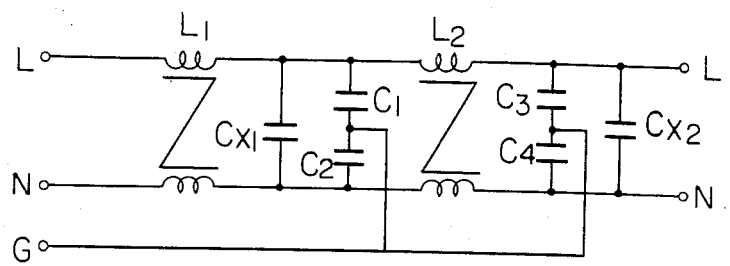
FIG. 1 is a circuit diagram of a line filter according to an embodiment of the present invention.
Figure 14:
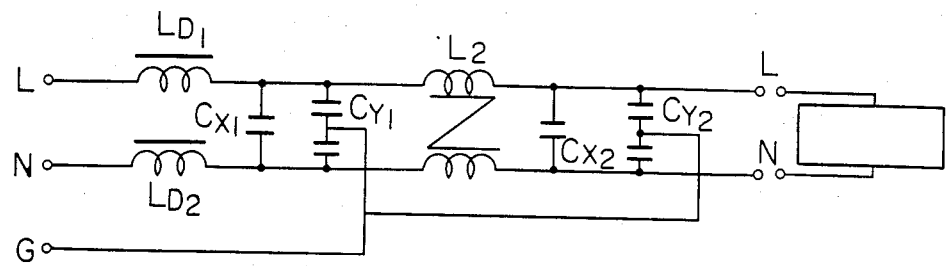
FIG. 14 is a circuit diagram of a conventional line filter.
Figure 15:
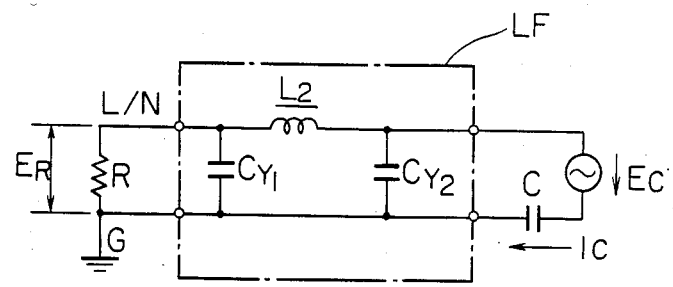
FIG. 15 is an equivalent circuit diagram arranged in accordance with a main feature of the line filter in FIG. 14.

FIG. 1 is a circuit diagram of a line filter according to an embodiment of the present invention. The same reference numerals in FIG. 1 denote the same parts as in FIGS. 14 and 15.

Referring to FIG. 1, a choke coil (to be referred to as a balun hereinafter) $L_1$ has a small distributed capacitance obtained by decreasing its inductance. A second balun $L_2$ has an inductance larger than that of the first balun $L_1$. X capacitors $C_{X1}$ and $C_{X2}$ are connected in the L - N path. Capacitors $C_1$, $C_2$, $C_3$, and $C_4$ serve as Y capacitors in the L/N - G path. The sum of the capacitances of the Y capacitors $C_1$ and $C_2$ is larger than that of the Y capacitors $C_3$ and $C_4$.

Assume that the line filter in this embodiment is used together with a 50-kHz switching power source unit and that an attenuation of 100 dB is guaranteed against 50-kHz noise. As a result, the inductances and capacitances of the line filter must be set as follows:

$L_1 = 2$ mH
Leakage inductance of $L_1 = 15$ μH
$L_2 = 30$ mH
Leakage inductance of $L_2 = 0.5$ mH
$C_{X1} = 0.3$ μF
$C_{X2} = 0.2$ μF
$C_1 = C_2 = 9,400$ pF
$C_3 = C_4 = 4,700$ pF The steps which led to the design of the line filter of this embodiment will be reviewed hereinafter.

Since the line filter in FIG. 1 has both X and Y capacitors, both normal mode noise and common mode noise can be eliminated. As described above, normal mode noise can be easily eliminated, so common mode noise reduction will be concentrated on below.

Figure 2:
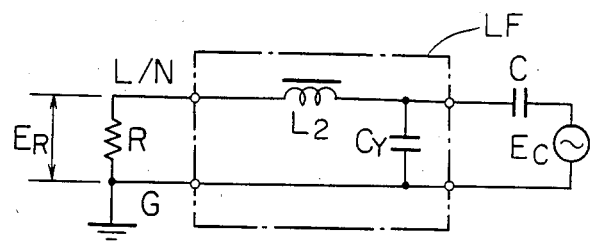
FIGS. 2, 3, and 5 are equivalent circuit diagrams for the line filter in FIG. 1.
Figure 3:
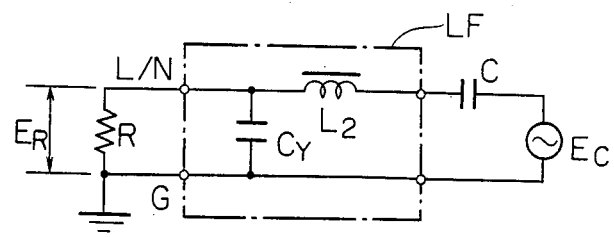

FIGS. 2 and 3 show different filter circuits having Y capacitors $C_Y$ inserted in different positions to determine which circuit is more suitable as a common mode noise reduction filter.

Referring to FIGS. 2 and 3, a reference symbol $E_C$ denotes a voltage generated as a noise source; $E_R$, a noise voltage appearing in the L/N - G path; C, the capacitance between ground and the primary winding of a transformer (not shown) in a switching power source unit; and R, an equivalent impedance for the noise source and the input line.

When an attenuation (IL) is defined as:

$$IL = 20\log_{10}(E_C/E_R) \text{ (dB)}$$

the filter in FIG. 2 has an attenuation $IL(\omega)$ given as:

$$IL(\omega) = 20\log \sqrt{(1 + C_Y/C)^2 + (1/\omega_0 CR)^2\{(\omega/\omega_0)^2 - (\omega_0/\omega)^2\}^2}$$

where $\omega_0$ is the resonant frequency corresponding to an abrupt drop in the attenuation and is defined as:

$$\omega_0 = 1/\sqrt{L_2(C_Y + C)}$$

On the other hand, the filter in FIG. 3 has an attenuation $IL(\omega)$ given as:

$$IL(\omega) = 20\log \sqrt{(1 + C_Y/C - \omega^2 L_2 C_Y)^2 + (\omega L_2/R - 1/\omega CR)^2}$$

wherein the resonant frequency $\omega_1$ is given as:

$$\omega_1 = 1/\sqrt{L_2\{C_Y C/(C_Y + C)\}}$$

In this case, if $\omega = \omega_1$, the attenuation can be derived as follows:

$$IL(\omega_1) = 20\log \sqrt{(1/\omega_1 C_Y R)}$$

The attenuation characteristics of the filter circuits of FIGS. 2 and 3 will be described with reference to FIG. 4.

Figure 4:
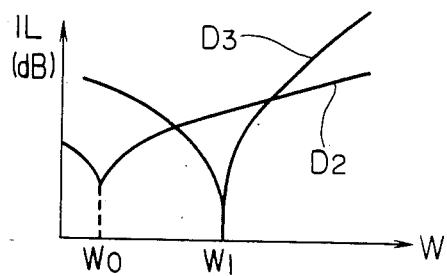
FIG. 4 is a graph showing attenuation characteristics of the circuits in FIGS. 2 and 3.

FIG. 4 is a graph showing the results given by the equations described above for explaining the relationship between frequency and attenuation in the filters in FIGS. 2 and 3. Referring to FIG. 4, a reference symbol $D_2$ denotes an attenuation characteristic curve of the filter in FIG. 2; and $D_3$, an attenuation characteristic curve of the filter in FIG. 3.

The calculations were done for the filters under the following conditions:

$L_2 = 30$ mH
$C_Y = 28$ nF
$C = 35$ pF
$R = 50$ Ω

As is apparent from FIG. 4, since the filter in FIG. 2 causes the attenuation of the choke coil $L_2$ to drop slightly, this filter is advantageous in guaranteeing attenuation in relatively low frequency ranges.

When the capacitance $C_Y$ and the inductance $L_2$ are given as:

$C_Y = 28$ nF
$L_2 = 30$ mH an attenuation of 100 dB against 50-kHz noise can be guaranteed at a switching frequency of 50 kHz. In this case, the choke coil, having a comparatively large inductance of 30 mH, is preferably constituted by a balun.

Since the core in the balun is not saturated by a differential current, a large inductance can be used for a noise voltage of an identical phase while a load current is flowing therethrough. However, a balun with a large inductance necessarily has a large number of turns and a large distributed capacitance. Such a balun cannot serve as a choke coil in the high frequency range of 1 MHz to 30 MHz. As a result, attenuation ability in the high frequency range drops. This high frequency range includes logic circuit noise components as which may be caused by a clock circuit used in a data processing circuit.

Figure 5:
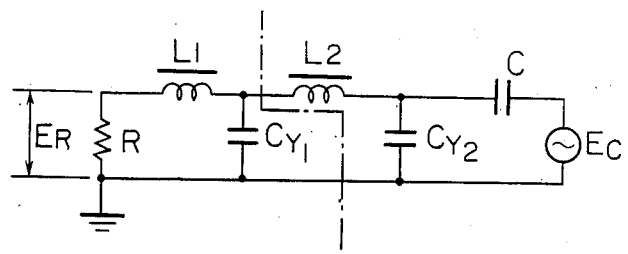

In order to prevent this, the balun $L_1$ shown in FIG. 5 is added.

The balun $L_1$ has a low inductance and a low distributed capacitance.

The attenuation $IL(\omega)$ of the filter in FIG. 5 is given as:

$$IL(\omega) = 20 \log \sqrt{[SQ + (S + 1)\{1 - (\omega/\omega_R)^2 Q\}]^2 + [PQ/\omega CR \times (1 + 1/S)\{[(\omega/\omega_R)^2 - A]^2 + B - A^2\}]^2}$$

where
$P = L_1/L_2$
$Q = C_{Y1}/C_{Y2}$
$S = C_{Y2}/C$
$A = [\{(Q+1) + (1/S)\}/Q\{1 + (1/S)\} + 1/PQ]/2$
$B = 1/[PQ\{1 + (1/S)\}]$
$\omega_R^2 = 1/L_2 C_{Y2}$ The attenuation of the filter in FIG. 5 at different frequencies was calculated, and a combination of capacitances $C_{Y1}$ and $C_{Y2}$ for maximizing attenuation at 50 kHz to 60 kHz was calculated. If the following conditions
$L_1 = 2$ mH
$L_2 = 30$ mH
$C = 35$ pF
$R = 50\ \Omega$
hold true, then
$C_{Y1} = 18.8$ nF
$C_{Y2} = 9.4$ nF
are suitable under the condition:

$C_{Y1} + C_{Y2} = 28$ nF

In the case described above, the sum of the Y capacitors $C_{Y1}$ and $C_{Y2}$ is 28.2 nF. However, since the capacitance of commercially available capacitors is not continuous, the above combination is optimal.

When the inductances of the baluns are inverted, i.e., when $L_1 = 30$ mH and $L_2 = 2$ mH, and the capacitors $C_{Y1}$ and $C_{Y2}$ vary under the condition $C_{Y1} + C_{Y2} = 28$ nF the attenuation at the frequency range of 50 kHz to 60 kHz drops considerably.

In this manner, when the inductance of the balun $L_1$ is significantly larger than that of the balun $L_2$, a lower peak of the attenuation IL occurs in the attenuation frequency band. Therefore, the inductance of the balun $L_1$ must be smaller than that of the balun $L_2$. The above test results provide the following conditions:
$L_1 = 2$ mH
$L_2 = 30$ mH
$C_{Y1} = 18.8$ nF
therefore,
$C_1 = C_2 = 9,400$ pF
$C_{Y2} = 9.4$ nF
therefore,
$C_3 = C_4 = 4,700$ pF
The filter in FIG. 1 is thus obtained.

When the filter of this embodiment is connected to the primary coil of the switching power source unit, a smoothing capacitor is inserted in parallel with the primary coil.

The capacitances of the X capacitors $C_{X1}$ and $C_{X2}$ are determined in accordance with the capacitance of the smoothing capacitor.

In this embodiment, the capacitances of the capacitors $C_{X1}$ and $C_{X2}$ are given as:
$C_{X1} = 0.3\ \mu F$,
$C_{X2} = 0.2\ \mu F$
When the leakage inductances of the baluns $L_1$ and $L_2$ are increased, normal mode noise can be virtually eliminated by the X capacitor combination of $C_{X1}$ and $C_{X2}$.

The balun leakage inductances are determined by the capacitance of the smoothing capacitor inserted at the primary coil side of the switching power source unit in the same manner as the capacitances of the X capacitors.

In this embodiment, the leakage inductances are set by the predetermined mathematical expressions:
Leakage inductance of $L_1 = 15\ \mu H$
Leakage inductance of $L_2 = 0.5$ mH In the line filter in FIG. 1, when the baluns $L_1$ and $L_2$ are arranged adjacent to each other, a common mode noise current from the switching power source unit flows in the balun $L_2$. A magnetic flux is generated by the balun $L_2$ and is coupled to the balun $L_1$, thereby inducing a voltage at the balun $L_1$. The common mode noise current produced by the induction voltage causes a stray capacitance on the input side. As a result, common mode noise leaks outside the apparatus.

An application for preventing common mode noise leakage will be described in detail with reference to FIGS. 6 to 12. The same reference numerals in FIGS. 6 to 12 denote the same parts as in FIG. 1.

Figure 6:
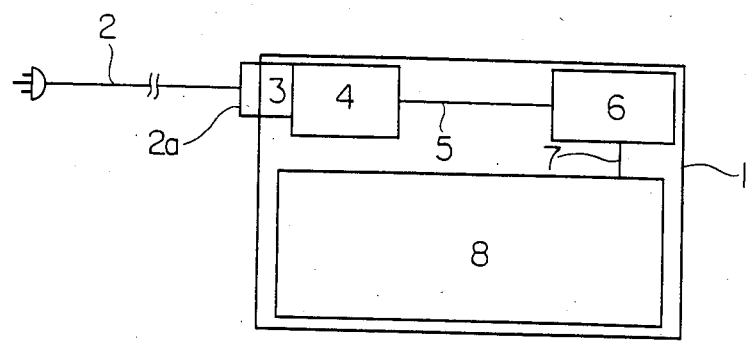
FIG. 6 is a schematic diagram of an electronic apparatus as an application employing the line filter in FIG. 1.

FIG. 6 shows an arrangement of an electronic apparatus with a line filter as an application of the present invention.

Referring to FIG. 6, the electronic apparatus has a housing 1, a power cord 2 one end of which has a plug and the other end of which has a cord connector 2a, an inlet 3 to be connected to the connector 2a, an AC input unit 4, a switching power source unit 6, a data processing unit 8, and internal wirings 5 and 7 for connecting the units.

The AC input unit 4 is arranged near the inlet 3, through which a portion of the power cord 2 extends into the housing 1. The AC input unit 4 is thus separated from the switching power source unit 6. The two units are connected via the internal wiring 5.

In the apparatus having the arrangement described above, the line filter in FIG. 1 is divided into front and rear stages. The front stage is mounted in the AC input unit 4, and the rear stage is mounted in the switching power source unit 6.

Figure 7:
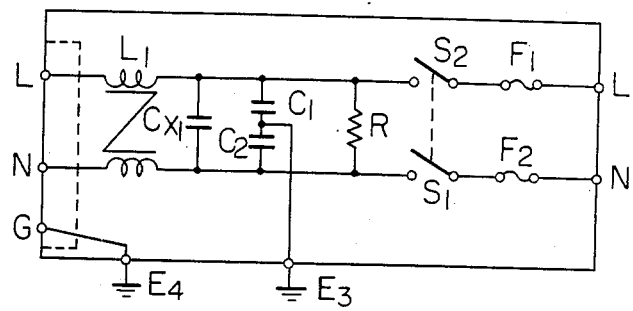
FIGS. 7, 8, and 9 are block diagrams showing the circuit arrangement of the unit in FIG. 6.

The arrangement of the front stage will be described with reference to FIG. 7.

In the front stage, a balun $L_1$ serves as a choke coil having a ring core and two coils with an identical phase. A capacitor $C_{X1}$ is inserted in the L - N path. Capacitors $C_1$ and $C_2$ are inserted in the L/N - G path. A resistor R is inserted in the L - N path. Switches $S_1$ and $S_2$ are inserted in the lines N and L, respectively. Fuses $F_1$ and $F_2$ are inserted in the lines L and N, respectively.

The arrangement of the rear stage will be described with reference to FIG. 8.

In the rear stage, a balun $L_2$ serves as a choke coil having a ring core and two coils with an identical phase, just as the balun $L_1$. A capacitor $C_{X2}$ is inserted in the L - N path. Capacitors $C_3$ and $C_4$ are inserted in the L/N - G path.

Since the rear stage is mounted in the switching power source unit, the arrangement of the switching power source unit will now be briefly described.

A rectifier Rect rectifies an AC voltage to a DC voltage. The DC voltage is smoothed by a smoothing capacitor $C_{F1}$. The emitter-collector path of a switching transistor $Q_P$ is inserted in one of the lines and is switched in response to a control signal from a control circuit (not shown). A rectifying diode $D_1$ rectifies a switching AC voltage induced at the secondary winding of a converter transformer T to obtain a DC voltage. The DC voltage is smoothed by a smoothing capacitor $C_{F2}$. The switching transistor $Q_P$ is switched to extract a DC output voltage Vo across the positive and negative terminals.

The front and rear stages are connected via an internal wiring to obtain a line filter function. The operation of the line filter as an application of the present invention will be described with reference to FIG. 9.

The common mode noise generated upon switching of the switching transistor $Q_P$ appears as a common mode noise current at the secondary winding of the converter transformer T through a stray capacitance Cc of the transformer T. The common mode noise current flows to a ground connecting point $E_1$ and flows into the circuit from primary winding ground connecting points $E_2$, $E_3$, and $E_4$ of the converter transformer T through chassis ground metal and ground lines.

Assume that common mode noise current components flowing from the ground connecting points $E_2$, $E_3$, and $E_4$ are defined as $i_{c1}$, $i_{c2}$, and $i_{c3}$, respectively. The common mode noise current component $i_{c1}$ returns to the switching power source unit through the Y capacitors $C_3$ and $C_4$. The noise component $i_{c2}$ returns to the line filter through the Y capacitors $C_1$ and $C_2$. The noise component $i_{c3}$ flows out of the line filter through the power cord 2 and returns thereto through stray capacitances $C_{S1}$ and $C_{S2}$. These stray capacitances are formed between ground and the power cord 2, interior wiring, or the like.

From the noise attenuation behavior of the line filter, it is clear that the noise current components have the following relationship:

$$|i_{c1}| > |i_{c2}| > |i_{c3}|$$

In this application, the path (a network consisting of the switching power source unit and the Y capacitors $C_3$ and $C_4$) of the largest switching noise current (i.e., $i_{c1}$) is shortened, and the network is spaced apart from the balun $L_1$. As a result, the leakage flux caused by the current $i_{c1}$ can be decreased, and hence common mode noise can be eliminated.

Furthermore, since the baluns $L_1$ and $L_2$ are spaced apart from each other at a predetermined distance, the magnetic flux from the balun $L_2$ due to the current $i_{c2}$ is not coupled to the balun $L_1$, and common mode noise can again be eliminated.

Figure 10:
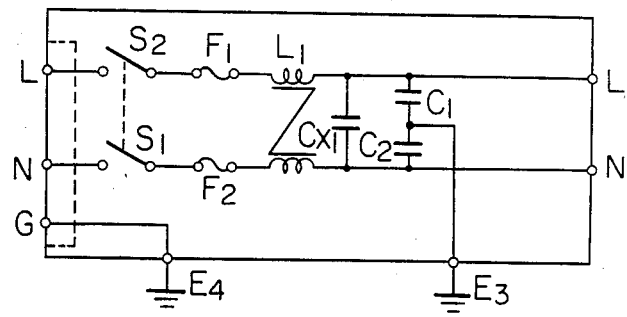
FIGS. 10, 11, and 12 are circuit diagrams showing modifications of the circuits in FIGS. 7 and 8.

In the application described above, the switches $S_1$ and $S_2$ and the fuses $F_1$ and $F_2$ of the front stage are inserted between the resistor R and the output terminals of the front stage, but the application is not limited to that arrangement. For example, as shown in FIG. 10, the switches $S_1$ and $S_2$ and the fuses $F_1$ and $F_2$ may be inserted between the input terminals of the front stage and the balun $L_1$.

Figure 8:
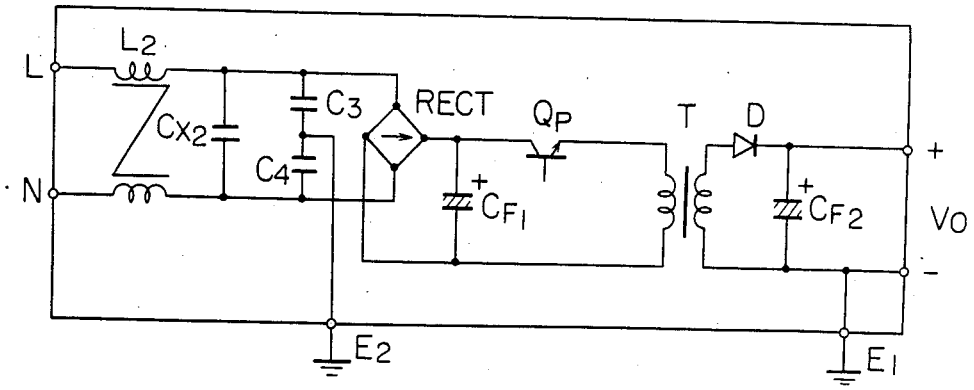
Figure 9:
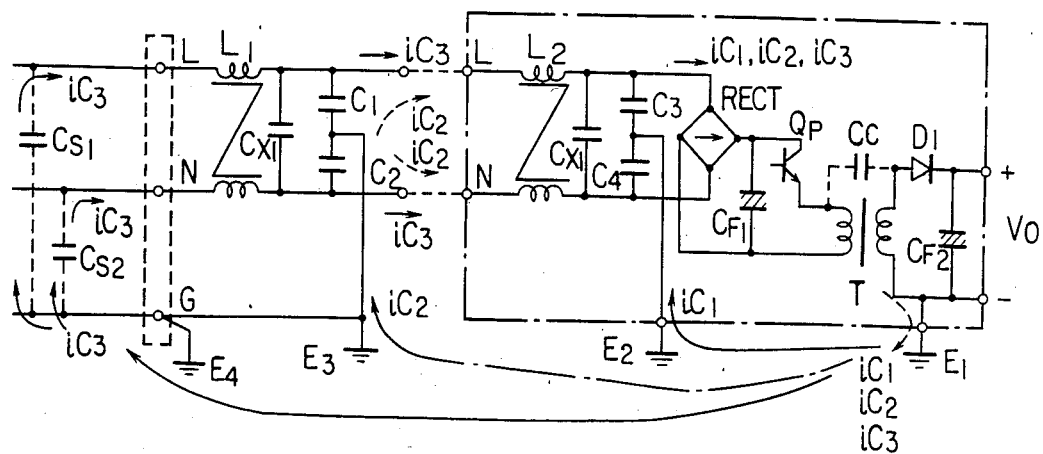
Figure 11:
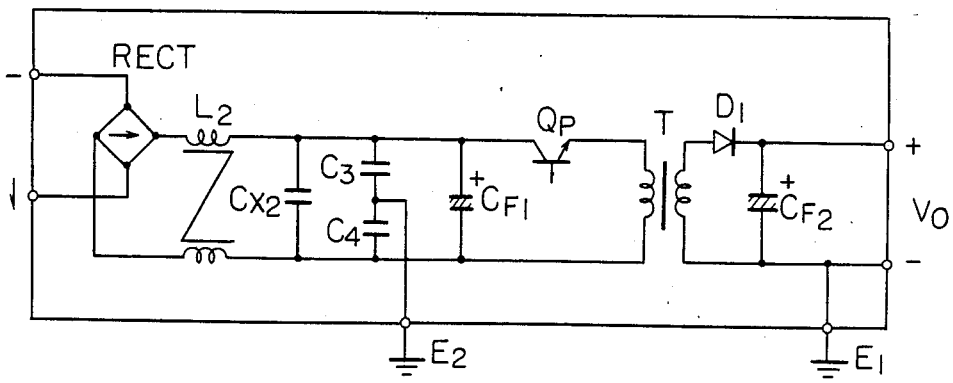

In the application described above, the rear stage of the line filter is inserted between the input terminal of the rear stage and the rectifier Rect, as shown in FIG. 8. However, as shown in FIG. 11, the rear stage may be inserted between the rectifier Rect and the switching power source unit.

Figure 12:
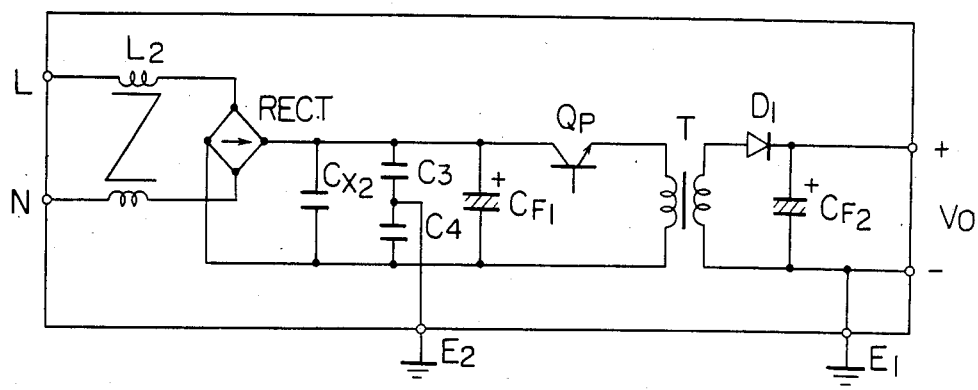

In the application described above, the Y capacitors $C_3$ and $C_4$ and the X capacitor $C_{X2}$ are inserted between the choke coil $L_2$ and the rectifier Rect, as shown in FIG. 8. However, as shown in FIG. 12, the Y capacitors $C_3$ and $C_4$ and the X capacitor $C_{X2}$ may be inserted in the line path between the rectifier Rect and the switching power source unit.

In the line filter shown in FIG. 1, assume that a leakage current $I_L$ must be reduced to, e.g., less than 1 mA. In this case, the capacitances of the Y capacitors must be about 8 nF. In order to obtain the same attenuation as previously described with reference to FIG. 1, the inductance of the balun $L_2$ must be tripled.

In order to obtain a balun with such a high inductance, the number of turns in the winding must be increased, and the distributed capacitance can no longer be ignored. Therefore, the impedance is decreased in the low-frequency range of 10 kHz to 1 MHz, thereby impairing filter functioning. In order to avoid this, the following arrangement is proposed as a modification of the present invention.

Figure 13:
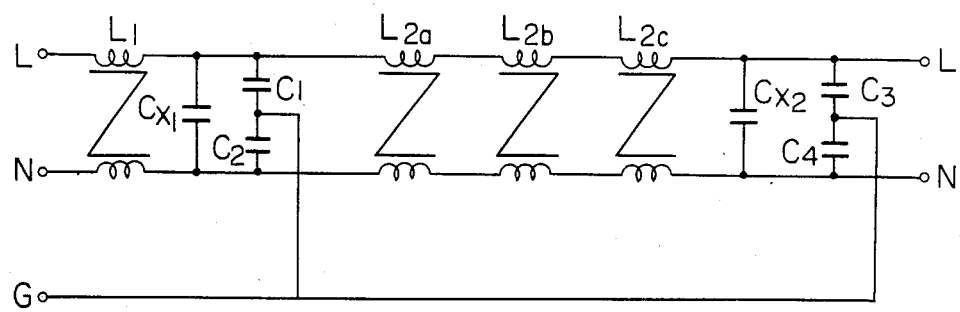
FIG. 13 is a circuit diagram showing a modification of the present invention.

FIG. 13 is a circuit diagram of a modification of the present invention designed to solve the above problem. The same reference numerals in FIG. 13 denote the same parts as in FIG. 1.

Referring to FIG. 13, a choke coil $L_1$ is constituted by a balun with a small distributed capacitance obtained by decreasing its inductance. Choke coils $L_{2a}$, $L_{2b}$, and $L_{2c}$ are constituted by baluns and are connected in series with each other. The sum of their inductances is larger than that of the balun $L_1$. Capacitors $C_{X1}$ and $C_{X2}$ are X capacitors inserted in the L - N path. Capacitors $C_1$, $C_2$, $C_3$, and $C_4$ are Y capacitors inserted in the L/N - G path. It should be noted that the sum of the capacitances of the Y capacitors $C_1$ and $C_2$ is larger than that of the Y capacitors $C_3$ and $C_4$.

In the line filter having the arrangement described above, the inductances of the baluns $L_{2a}$, $L_{2b}$, and $L_{2c}$ are small, so the number of turns and hence the distributed capacitance of the winding in each are also small. In addition, since the baluns $L_{2a}$, $L_{2b}$, and $L_{2c}$ are connected in series with each other, the total distributed capacitance of the baluns $L_{2a}$, $L_{2b}$, and $L_{2c}$ is further decreased. Total impedance can thus be kept high even in the low frequency range of 10 kHz to several megahertz.

Furthermore, the total inductance of the baluns $L_{2a}$, $L_{2b}$, and $L_{2c}$ is given as $L_{2a}+L_{2b}+L_{2c}$, since they are connected in series with each other. A high total inductance is thus guaranteed.

Assume that the following values are given for the balun $L_2$ shown in FIG. 1:
Inductance $L_2 = 100$ mH
Distributed capacitance $C_{L2} = 10$ pF If the baluns $L_{2a}$, $L_{2b}$, and $L_{2c}$ are to obtain the same inductance as that of the balun $L_2$ (FIG. 1), for example, if $L_{2a} = L_{2b} = L_{2c} = 33$ mH
then $$L_{2a}+L_{2b}+L_{2c} \approx 100 \text{ mH}$$

Distributed capacitances $C_{L2a}$, $C_{L2b}$, and $C_{L2c}$ of the baluns $L_{2a}$, $L_{2b}$, and $L_{2c}$ in the line filter of the modification are given as:

$C_{L2a} = C_{L2b} = C_{L2c} = 3$ pF

When the total distributed capacitance is defined as $C_L$, the following relation is established:

$$1/C_L = 1/C_{L2a} + 1/C_{L2b} + 1/C_{L2c}$$

Therefore $C_L = 1$ pF

In order to decrease the leakage current $I_L$ in the line filter described above, the capacitances of the Y capacitors must be decreased, and the inductances of the baluns $L_{2a}$, $L_{2b}$, and $L_{2c}$ must be increased. In this case, the total impedance can be increased since the balun $L_2$ (FIG. 1) is divided into the baluns $L_{2a}$, $L_{2b}$, and $L_{2c}$ to decrease the distributed capacitance thereof. The desired attenuation can thus be obtained.

Since the balun $L_2$ is divided into the baluns $L_{2a}$, $L_{2b}$, and $L_{2c}$, the size of other components can be kept small while the predetermined capacitance is maintained, thus providing a compact line filter.

In addition, the division of the balun $L_2$ into the baluns $L_{2a}$, $L_{2b}$, and $L_{2c}$ allows the use of standard components, thereby decreasing manufacturing costs.

According to the embodiment described above, the first and second choke coils are constituted by baluns, and the inductance of the second balun is larger than that of the first balun. Therefore, the total capacitance of the Y capacitors can be kept low, and common mode noise can be eliminated without increasing the size of the choke coil.

According to the application of the present invention, the line filter is divided into a front stage containing the balun $L_1$ and a rear stage containing the balun $L_2$. The front stage is separated from the rear stage to prevent leakage of common mode noise from the load through the input terminals of the line filter.

According to the modification of the present invention, the balun $L_2$ is divided into the baluns $L_{2a}$, $L_{2b}$, and $L_{2c}$, which are connected in series with each other, thereby increasing the total inductance of the balun $L_2$, decreasing the leakage current, and providing the desired attenuation.

What is claimed is:

1. A line filter circuit for attenuating both normal and common mode noise currents in a power line having at least a pair of conductors connecting a source of electricity to an electronic device, said filer circuit comprising:

first and second reactor means each including a magnetic core having a pair of windings thereon, each winding of said pair being wound to cancel the magnetic flux in the other of said pair, said one winding of each of said pair of said first and second reactor means being connected in series with each other and in series with one of said pair of conductors;

said second reactor means being connected between said first reactor means and the electronic device;

said first reactor means having an inductance of a selected value for attenuating frequencies in a high range;

said second reactor means having an inductance of a selected value larger than the selected value of said first reactor means for attenuating frequencies in a range lower than said first reactor means;

first capacitor means having one side connected to one of said conductors and the other side connected to the other of said conductors, operative to cooperative with said first and second reactor means for attenuating normal mode currents;

second capacitive means including a plurality of capacitors each having one side connected in common to ground and the other side connected to a respective one of said conductors between the windings of said second reactor means and the input of the electronic device, operative to cooperate with said first and second reactor means for attenuating common mode currents.

2. A line filter circuit according to claim 1, further including second capacitance means each connected between ground and a point on one of said lines between said first reactor means and said second reactor means for attenuating common mode currents.

3. A line filter circuit according to claim 2, wherein the total capacitance of said second capacitive means is larger than that of said first capacitive means.

4. A line filter circuit according to claim 1, wherein said first capacitive means includes a first line-to-line capacitor connected between said lines at a point between said first and second reactor means, and a second line-to-line capacitor connected between said lines at a point between said second reactor means and said input terminal of said electronic apparatus.

5. A line filter circuit according to claim 4, wherein the capacitance of said first line-to-line capacitor is larger than that of said second line-to-line capacitor.

6. A line filter circuit according to claim 1, wherein said first reactor means is magnetically separated from said second reactor means so that the magnetic flux generated by said second winding does not interfere with said first reactor means.

7. A line filter circuit according to claim 6, wherein said first reactor means is arranged in a first stage, and said second reactor means and said first line-to-ground capacitor are arranged in a second stage, said first stage being magnetically separated from said second stage.

8. A line filter circuit according to claim 7, wherein said first stage is spaced apart from said second stage.

9. A line filter circuit according to claim 1, wherein said electronic apparatus includes an electronic circuit and DC power source means connected with said power source lines for generating a DC output voltage used to drive said electronic circuit.

10. A line filter circuit according to claim 9, wherein said second reactor means, said first line-to-ground capacitor and said DC power source means are arranged in a second stage, said second stage being magnetically separated from said first reactor means.

11. A line filter circuit according to claim 10, wherein said DC power source means includes rectifying means for rectifying an AC voltage supplied through said power source lines, a transformer having a first winding and a second winding, switching means for switching said DC voltage being supplied to said first winding of said transformer and means for rectifying and smoothing the output voltage of said second winding of said transformer.

12. A line filter circuit according to claim 10, wherein said first reactor means is arranged in a first stage which is magnetically separated from said second stage.

13. A line filter circuit according to claim 12, wherein said first stage is spaced apart from said second stage.

14. A line filter circuit according to claim 9, wherein said electronic circuit includes a data processing unit.

15. A line filter circuit according to claim 1, wherein said second reactor means includes a plurality of reactors connected in series, each of which include a core having at least one magnetic path and windings each connected in series with one of said lines in such a way that the magnetic flux associated with each of said windings is cancelled by the flux associated with the other of said windings, and the total inductance of said reactors is larger than that of said first reactor means.

16. A line filter circuit according to claim 15, wherein said reactors are magnetically separated from said first reactor means.

17. A line filter circuit according to claim 16, wherein said first reactor is spaced apart from said reactors.

18. A line filter circuit according to claim 16, wherein said first reactor means is arranged in a first stage, and said reactors are arranged in a second stage which is magnetically separated from said first stage.

19. A line filter circuit according to claim 18, wherein said first stage is spaced apart from said second stage.

* * * * *